United States Patent
Lin et al.

(10) Patent No.: US 9,711,463 B2
(45) Date of Patent: Jul. 18, 2017

(54) DICING METHOD FOR POWER TRANSISTORS

(71) Applicant: Taiwan Semiconductor Manufacturing Co., Ltd., Hsin-Chu (TW)

(72) Inventors: Yu-Syuan Lin, Lukang Township (TW); Jiun-Lei Jerry Yu, Zhudong Township (TW); Ming-Cheng Lin, Yilan (TW); Hsin-Chieh Huang, Hsin-Chu (TW); Chao-Hsiung Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/596,326

(22) Filed: Jan. 14, 2015

(65) Prior Publication Data
US 2016/0204074 A1    Jul. 14, 2016

(51) Int. Cl.
*H01L 21/00*    (2006.01)
*H01L 23/00*    (2006.01)
(Continued)

(52) U.S. Cl.
CPC .......... *H01L 23/562* (2013.01); *H01L 21/784* (2013.01); *H01L 23/5226* (2013.01);
(Continued)

(58) Field of Classification Search
CPC . H01L 23/562; H01L 23/585; H01L 23/5226; H01L 29/2003; H01L 29/78;
(Continued)

(56) References Cited

U.S. PATENT DOCUMENTS

| | | | |
|---|---|---|---|
| 5,024,970 A * | 6/1991 | Mori | H01L 21/3043 148/DIG. 28 |
| 6,737,606 B2 | 5/2004 | Peng et al. | |
| 7,374,971 B2 * | 5/2008 | Yuan | H01L 21/78 257/E21.599 |
| 7,838,906 B2 * | 11/2010 | Sato | H01L 21/8252 257/183 |

(Continued)

OTHER PUBLICATIONS

Baker, et al. "High-Voltage GaN-on-Si Devices Deliver High Power." Microwaves & RF. Retrieved on Jan. 14, 2015 from http://mwrf.com/print/analog-semiconductors/high-voltage-gan-si-devices-deliver-high-power.

*Primary Examiner* — Nikolay Yushin
(74) *Attorney, Agent, or Firm* — Eschweiler & Potashnik, LLC

(57) ABSTRACT

Some embodiments relate to a method of dicing a semiconductor wafer. The semiconductor wafer that includes a device structure that is formed within a device layer. The device layer is arranged within an upper surface of the device layer. A crack stop is formed, which surrounds the device structure and reinforces the semiconductor wafer to prevent cracking during dicing. A laser is used to form a groove along a scribe line outside the crack stop. The groove extends completely through the device layer, and into an upper surface region of the semiconductor wafer. The semiconductor wafer is then cut along the grooved scribe line with a cutting blade to singulate the semiconductor wafer into two or more die. By extending the groove completely through the device layer, the method avoids damage to the device layer caused by the blade saw, and thus avoids an associated performance degradation of the device structure.

20 Claims, 10 Drawing Sheets

(51) Int. Cl.
   *H01L 29/00* (2006.01)
   *H01L 29/20* (2006.01)
   *H01L 29/78* (2006.01)
   *H01L 23/58* (2006.01)
   *H01L 23/522* (2006.01)
   *H01L 21/784* (2006.01)

(52) U.S. Cl.
   CPC ........ *H01L 23/585* (2013.01); *H01L 29/2003* (2013.01); *H01L 29/78* (2013.01); *H01L 2924/0002* (2013.01)

(58) Field of Classification Search
   CPC ......... H01L 29/0657; H01L 2924/0002; H01L 2924/00014; H01L 2924/00
   See application file for complete search history.

(56) References Cited

U.S. PATENT DOCUMENTS

| | | | |
|---|---|---|---|
| 7,871,902 B2 * | 1/2011 | Kaltalioglu | H01L 21/31116 257/508 |
| 7,955,955 B2 * | 6/2011 | Lane | H01L 21/563 438/113 |
| 8,008,750 B2 * | 8/2011 | Kaltalioglu | H01L 21/78 257/620 |
| 8,748,295 B2 * | 6/2014 | Kaltalioglu | H01L 22/34 438/462 |
| 2006/0237850 A1 * | 10/2006 | Yuan | H01L 21/78 257/774 |
| 2010/0207237 A1 | 8/2010 | Yao et al. | |
| 2010/0289021 A1 | 11/2010 | Wu | |

* cited by examiner

DICING METHOD FOR POWER TRANSISTORS

BACKGROUND

A high-electron-mobility transistor (HEMT) is a type of field-effect transistor (FET). Whereas a traditional n-type FET includes a gate electrode arranged over a p-type doped channel region that separates n-type source/drain regions, for example, a HEMT device uses a heterojunction as the channel instead of a doped region. This heterojunction is defined by an interface, at which two semiconducting materials with different band gaps meet one another. HEMT devices show very promising performance in high-power and high-frequency applications.

An integrated circuit (IC) containing a HEMT device is generally formed from a semiconductor wafer. The semiconductor wafer has a plurality of ICs arranged in rows and columns. The semiconductor wafer is sawn or "diced" into rectangularly-shaped discrete ICs along two mutually perpendicular sets of parallel lines or "streets" lying between each of the rows and columns thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
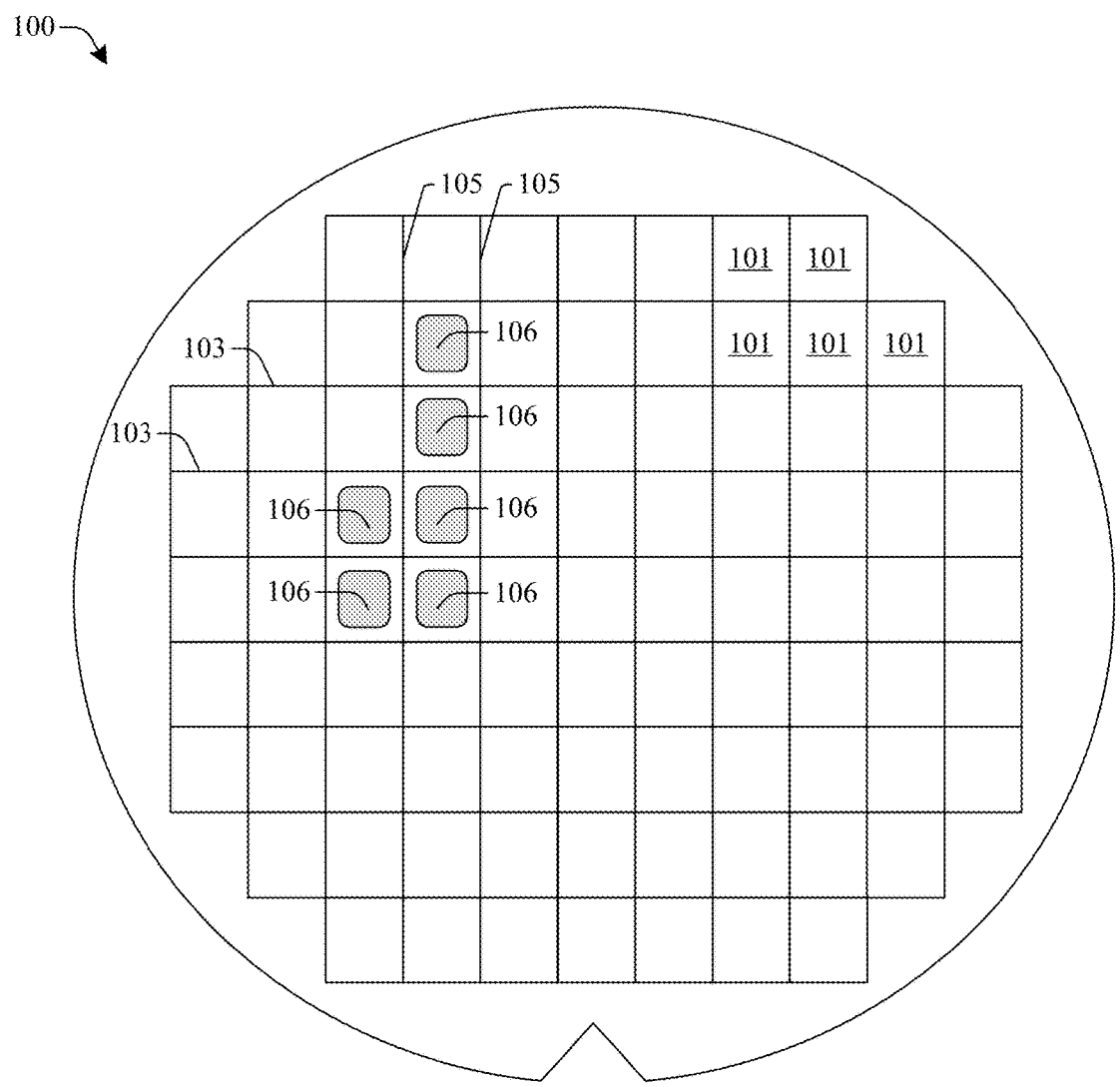
FIGS. 1A-1C illustrate a wafer having multiple die.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first substratelectric layer" described in connection with a first figure may not necessarily corresponding to a "first substratelectric layer" described in connection with another figure.

High power field-effect transistors (HPFET) devices are often formed from one or more device layers arranged over a substrate. A high-electron-mobility transistor (HEMT) device, for example, is one example of a HPFET. A HEMT is formed from a device layer, which includes a group III-V compound, such as aluminum gallium nitride (AlGaN), and a III-N (tri nitride) compound, such as gallium nitride (GaN). A wide bandgap of the III-V compound forms a heterojunction with a narrow bandgap of the III-N compound. Lattice constants of these two materials are typically slightly different, which produces a strain that can result in pizeoelectrically-induced polarization band bending at the heterojunction interface. Consequently, electrons are confined to a local band minimum near the interface, which forms a two-dimensional electron gas (2DEG) that acts as a channel of the HEMT device.

Some HEMT devices include an AlGaN/GaN device layer arranged over a silicon (Si) wafer. Si offers a low cost substrate suitable for high volume manufacturing. However, unlike GaN and AlGaN, Si and GaN have a large mismatch in lattice constants and coefficients of thermal expansion (CTEs). Consequently, thermal and mechanical stress during blade saw dicing of the Si wafer could distort a lattice structure of the GaN, which can increase leakage and decrease breakdown voltage, thus degrading the performance of the HEMT device. The effects of the thermal and mechanical stress experienced by the HEMT device during dicing can be mitigated by increasing a distance between the HEMT device and an edge of the die on which it resides (i.e., the dicing "street"). However, this increases die area, and hence cost. The effects of dicing can also be mitigated by using a laser to dice the Si wafer, which avoids the thermal and mechanical stress created by the blade saw. However, laser dicing of a wafer takes longer than blade saw dicing, and hence decreases manufacturing throughput.

Therefore, the present disclosure is directed to a method of dicing a semiconductor wafer. The semiconductor wafer includes a device structure that is formed within a device layer. A crack stop is formed, which surrounds the device structure and reinforces the semiconductor wafer to prevent cracking during dicing. A laser is used to form a groove along a scribe line outside the crack stop. The groove extends completely through the device layer, and into an upper surface region of the semiconductor wafer. The semiconductor wafer is then cut along the grooved scribe line with a cutting blade to singulate the semiconductor wafer into two or more die. By extending the groove completely through the device layer with the laser, the method avoids damage to the device layer caused by the blade saw, and thus avoids an associated performance degradation of the device structure. Other embodiments are also disclosed.

FIG. 1A illustrates a semiconductor wafer 100 having multiple individual die 101 in accordance with some embodiments. Each individual die 101 has a high power device structure 106 formed thereon. The individual die 101 are separated from one another by "dicing" the semiconductor wafer 100 along orthogonal scribe lines (or saw "streets") 103, 105 using a two act singulation process. First, a laser forms grooves along the scribe lines 103, 105. These grooves extend through any epitaxial device layers, such as III-V layers, formed over an upper surface of the semiconductor wafer 100, and extend below an upper surface of the semiconductor wafer 100 beneath the epitaxial device layer 104. Next, a blade saw is used to saw or cut from below the upper wafer surface, and completely through the scribe lines 103, 105, to separate the individual die 101 from one another. A crack stop (108, shown in FIG. 2A) is arranged around a periphery of the high power device structure 106 of each die 101 to prevent or reduce the likelihood of cracking in the die 101 during the two-act singulation process.

Figure 1B:
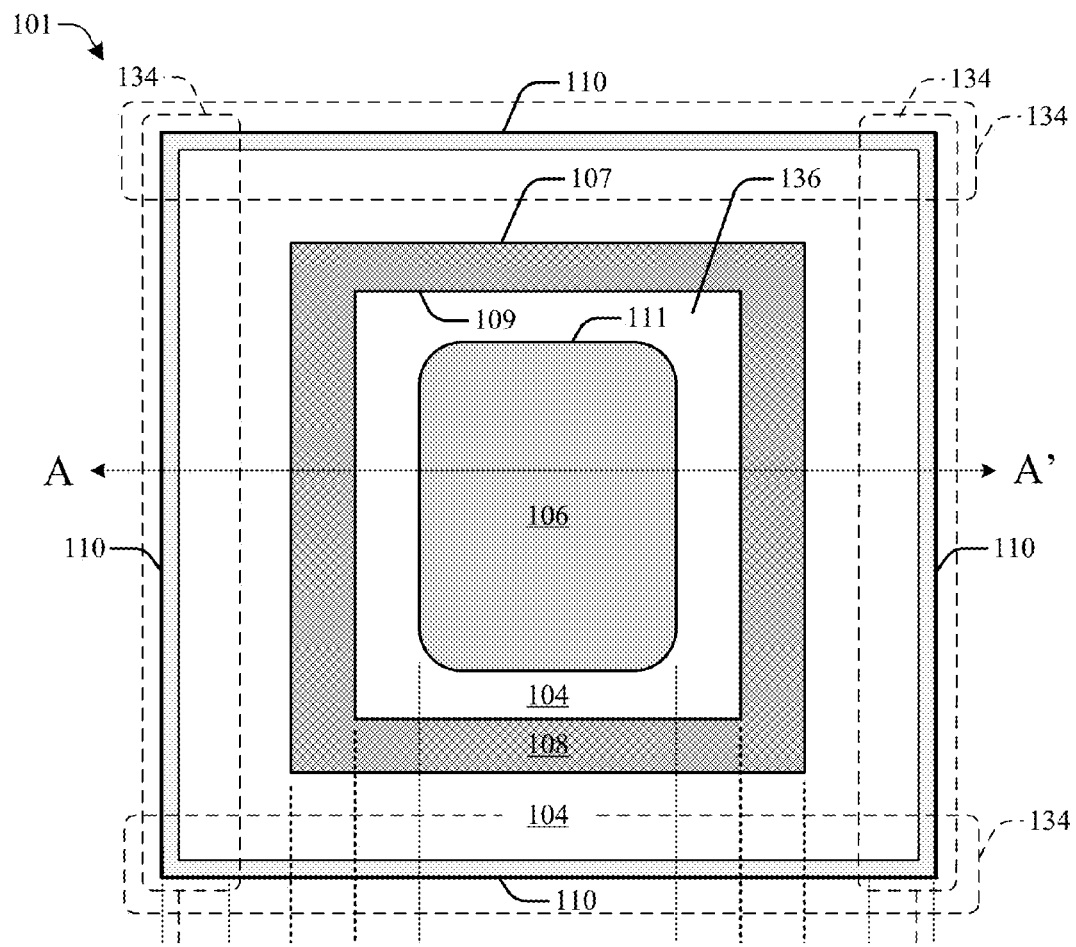
Figure 1C:
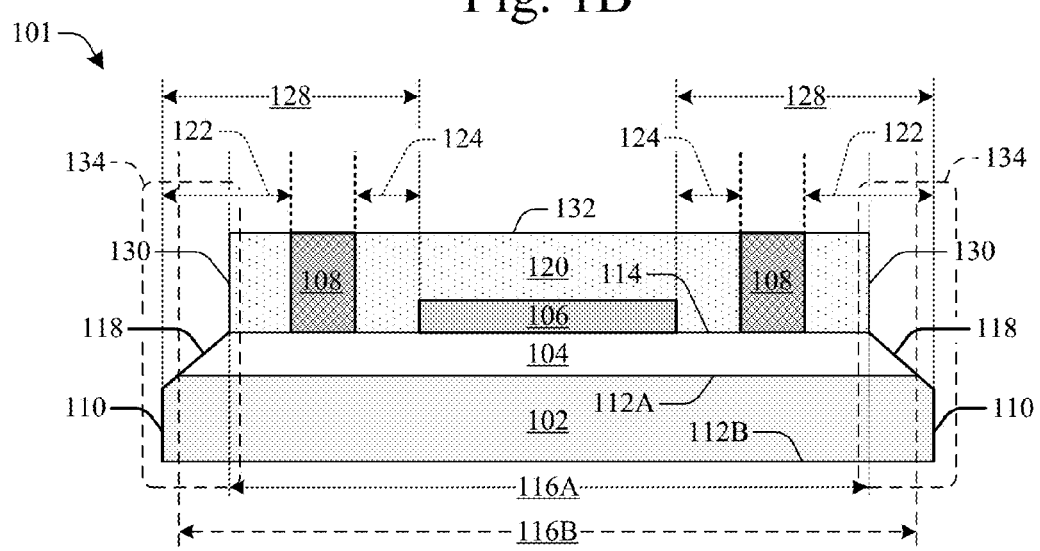

FIG. 1B illustrates an exploded view of an individual die 101 of semiconductor wafer 100. FIG. 1C illustrates an exploded cross sectional view of the individual die 101. The die 101 includes a substrate 102 (i.e., diced portion of the semiconductor wafer 100). The substrate 102 includes upper and lower substrate surfaces 112A, 112B, and a vertical substrate sidewall 110. The vertical substrate sidewall 110 corresponds to an outermost edge of the substrate 102. A device layer 104 is arranged over the upper substrate surface 112A. A device structure 106 (e.g., a HEMT) is arranged over an upper surface 114 of the device layer 104. The crack stop 108 is also arranged over the upper surface 114 of the device layer 104. The crack stop 108 has an outer perimeter 107 that is spaced apart laterally from the vertical substrate sidewall 110 by a first distance 122. The die 101 also includes a tapered sidewall 118 extending downward through at least a portion of the device layer 104 to meet the vertical substrate sidewall 110. For the die 101, the tapered sidewall 118 extends through the entire device layer 104 and beneath the upper substrate surface 112A before meeting the vertical substrate sidewall 110.

In some embodiments, the tapered sidewall 118 results in a tapered width of the device layer 104, such that an upper device layer surface 114 has a first width 116A, which is less a second width 116B at the lower device layer surface (i.e., at an interface with the upper substrate surface 112A). A dielectric layer 120 is arranged over the device layer 104 and the device structure 106. The dielectric layer 120 has vertical dielectric sidewalls 130, which extend downward from an upper surface 132 of the dielectric layer 120 to meet an uppermost point of the tapered sidewall 118. The die 101 further comprises an isolation region 136 between an inner edge 109 of the crack stop 108 and an outer perimeter 111 the device structure 106, which are spaced apart by a second distance 124. The vertical substrate sidewall 110, tapered sidewall 118, and the vertical dielectric sidewalls 130 form correspond to a scribe line prior to the die 101 being singulated from the semiconductor wafer 100. The vertical dielectric sidewalls 130 and the tapered sidewall 118 are formed by a laser during the first act of a two-act singulation process. The vertical substrate sidewall 110 is formed by a blade saw during the second act of the two-act singulation process. The crack stop 108 also provides mechanical reinforcement of the substrate 102 during the second act.

A combination of the two-act singulation process and the crack stop 108 provides for a reduction in an area of the individual die 101 over some conventional dicing methods, without sacrificing performance of the device structure 106 or manufacturing throughput. By grooving completely through the device layer 104 with the laser, the device layer 104 is not subjected to thermal and mechanical stress from the blade saw, which prevents damage to the device layer 104. Such damage includes degradation of a lattice structure of the device layer 104, formation of lattice defects within the device layer 104, and formation of interface states between the device layer 104 and the substrate 102, among others. Consequently, for a device structure 106 such as a HEMT device, for example, the combination of the two-act singulation process and the crack stop 108 prevents the reduction of performance metrics, such as decreased electron mobility, off-state leakage, charge trapping of electrons from the 2DEG by the interface states, and a reduction breakdown voltage. In some embodiments, the third distance 128 by which the outer perimeter 107 of the crack stop 108 is spaced apart laterally from the vertical substrate sidewall 110 is decreased from several millimeters (mm) to less than 100 microns ($\mu$m).

Figure 2A:
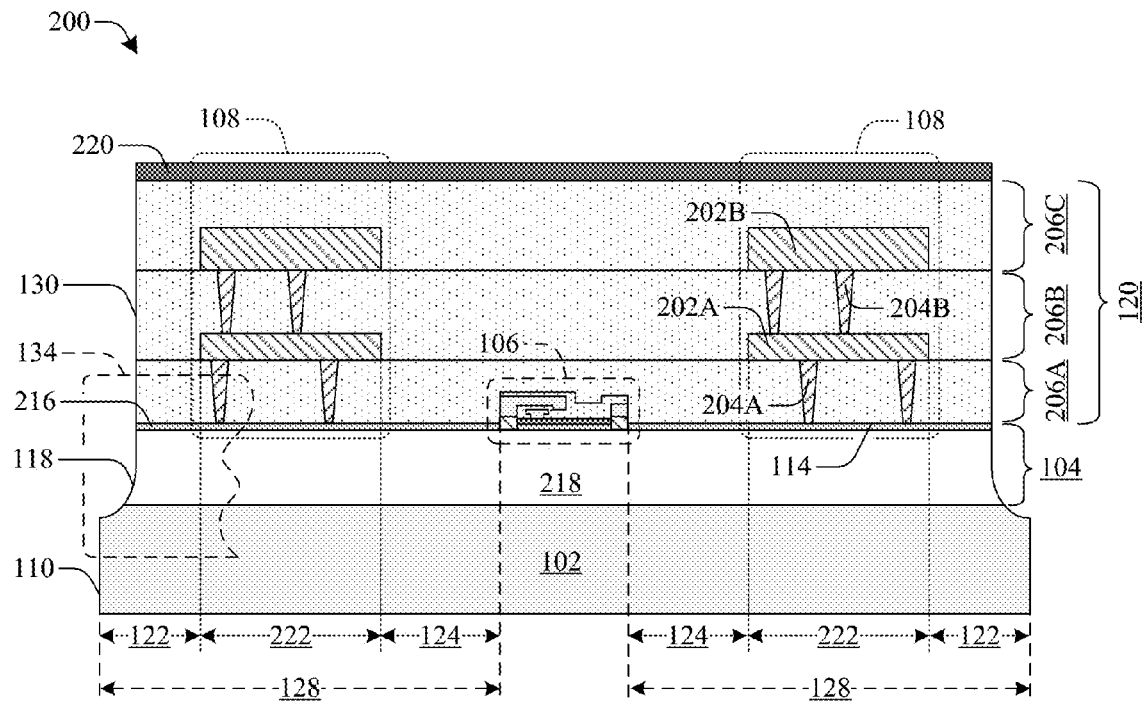
FIGS. 2A-2B illustrate a cross-sectional view of a diced substrate in accordance with some embodiments.

FIG. 2A illustrates a cross-sectional view of a die 200 in accordance with some embodiments. The die 200 includes a crack stop 108, which surrounds a device structure 106. The crack stop 108 includes a plurality of stacked alternating metal layers and dielectric layers overlying the substrate 102. A plurality of first vias 204A form connections from a first metallization layer 202A to an upper surface 114 of the device layer 104. The plurality of first vias 204A are disposed within an inter-level dielectric (ILD) layer 206A. The first metallization layer 202A is disposed within an inter-metal dielectric (IMD) layer 206B. A plurality of second vias 204B are disposed within the IMD layer 206B, and connect the first metallization layer 202A to a top metallization layer 202B, which is disposed within an oxide layer 206C (e.g., $SiO_2$). A passivation layer 220 (e.g., silicon nitride (SiN)) is disposed above the oxide layer 206C. The passivation layer 220 is configured to protect the die from environmental factors that can lead to corrosion of the first or second metallization layers 202A, 202B or first or second vias 204A, 204B, or contamination to the ILD layer 206A, the IMD layer 206B, or the oxide layer 206C.

Although only first or second metallization layers 202A, 202B are shown for the crack stop 108, it is appreciated that the crack stop 108 may include any number n of metallization layers, with n-1 first IMD layers disposed therebetween, as desired for a particular process or circuit application. In various embodiments, the ILD layer 206A includes one or more insulating materials. For example, and without limiting the types of insulating materials that may be used, the dielectric layers may be an oxide, an organo-silicate glass, organic or inorganic, low-k dielectric constant material (k<4) or ultra low-k dielectric constant material (k<2.5), or may be formed of any other suitable dielectric material(s). This material may be porous or non-porous. In various embodiments, the ILD layer 206A and the IMD layer 206B include dielectric materials that are the same, or different from one another. In various embodiments, the first and second metallization layers 202A, 202B and first or second vias 204A, 204B include copper, tungsten, aluminum, silver, gold, other metals, or alloys thereof.

For the embodiments of die 200, the crack stop 108 has a width 222 of about 25 $\mu$m. The crack stop 108 is spaced apart laterally from the vertical substrate sidewall 110 by a first distance 122 of about 30 $\mu$m. The crack stop 108 and the device structure 106 are spaced apart by a second distance 124 of about 25 $\mu$m. Consequently, the device structure 106 is laterally separated from the vertical substrate sidewall 110 of the substrate 102 by a third distance 128 of about 80 $\mu$m.

The close proximity between the device structure 106 and the vertical substrate sidewall 110 of the die 200 is achievable because of the two-act process of dicing the die 200, which first forms a vertical dielectric sidewall 130 and a tapered sidewall 118 with a laser, and then forms a vertical substrate sidewall 110 with a blade saw. The laser grooves completely through the dielectric layer 120 and the device layer 104, thus avoiding damage to the device layer 104 caused by mechanical and thermal stress of the blade saw. The two act process therefore provides for the third distance between the device structure 106 (e.g., transistor) and the vertical substrate sidewall 110, which is about 3 orders or magnitude less than some conventional approaches that use a blade saw alone, while providing equivalent performance of the transistor. For example, for a HEMT device, a breakdown voltage of over 700 volts (V) is maintained for a third distance 128 of 80 µm. By comparison, some conventional approaches that use blade saw cutting alone require a third distance 128 of greater than about 1 mm to achieve a comparable breakdown voltage. For conventional blade saw only dicing methods that use a third distance 128 comparable to 80 µm, the breakdown voltage is decreased by over 100 V, because of damage caused to the device layer 104 by the blade saw. In addition, some conventional blade saw only dicing methods for HEMTs could increase the on state resistance ($R_{DSon}$) between the drain and source by a factor of about 20 over the two act dicing process disclosed herein.

Figure 2B:
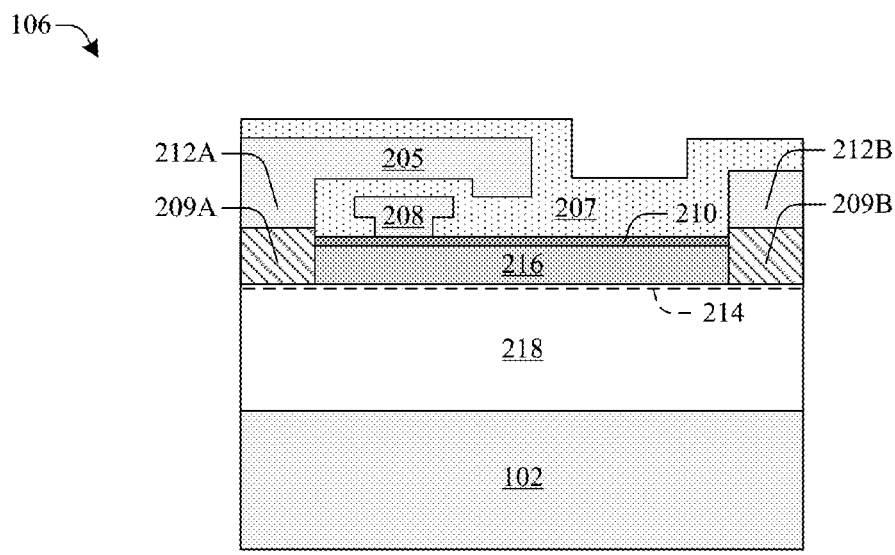

FIG. 2B illustrates a cross-sectional view of some embodiments of the device structure 106. Other device structure embodiments are also contemplated. The device structure 106 comprises a HEMT having Ohmic contacts to 209A, 209B to a 2DEG 214. In various embodiments, the Ohmic contacts 209A, 209B comprise aluminum (Al), titanium (Ti), or a combination thereof. Source and drain metallizations 212A, 212B are arranged above and in contact with the Ohmic contacts 209A, 209B. In some embodiments, the source and drain metallizations 212A, 212B comprise Al. A GaN cap 210 is positioned over the AlGaN layer 216. A gate 208 is positioned over the GaN cap 210. The gate 208 forms a Schottky contact with the GaN cap 210. In some embodiments, the gate 208 comprises nickel (Ni). A silicon nitride (SiN) passivation layer 207 is formed over the gate 208 and the GaN cap 210. A metal field plate 205, which is formed from a same material as the source metallization 212A, is arranged within the SiN passivation layer.

In an on state of the HEMT 106 a positive voltage is applied to the drain metallization 212B, which promotes the flow of electrons from the source metallization 212A, through the 2DEG 214, to the drain metallization 212B. In an off state, a negative voltage is applied to the gate 208, which repels electrons to create a discontinuity in the 2DEG 214.

It is also appreciated that other types of device structure 106 can be utilized. For example, a Schottky barrier diode (SBD) is similar to the HEMT without a source. The gate 208 acts as an anode, and the drain metallization 212B acts as the cathode.

Although the AlGaN layer 216 and GaN layer 218 are provided as one example of a II-V compound, it is appreciated that any II-V compound can be used to form a heterostructure, and the heterostructure is in no way limited to GaN and AlGaN.

Figure 3:
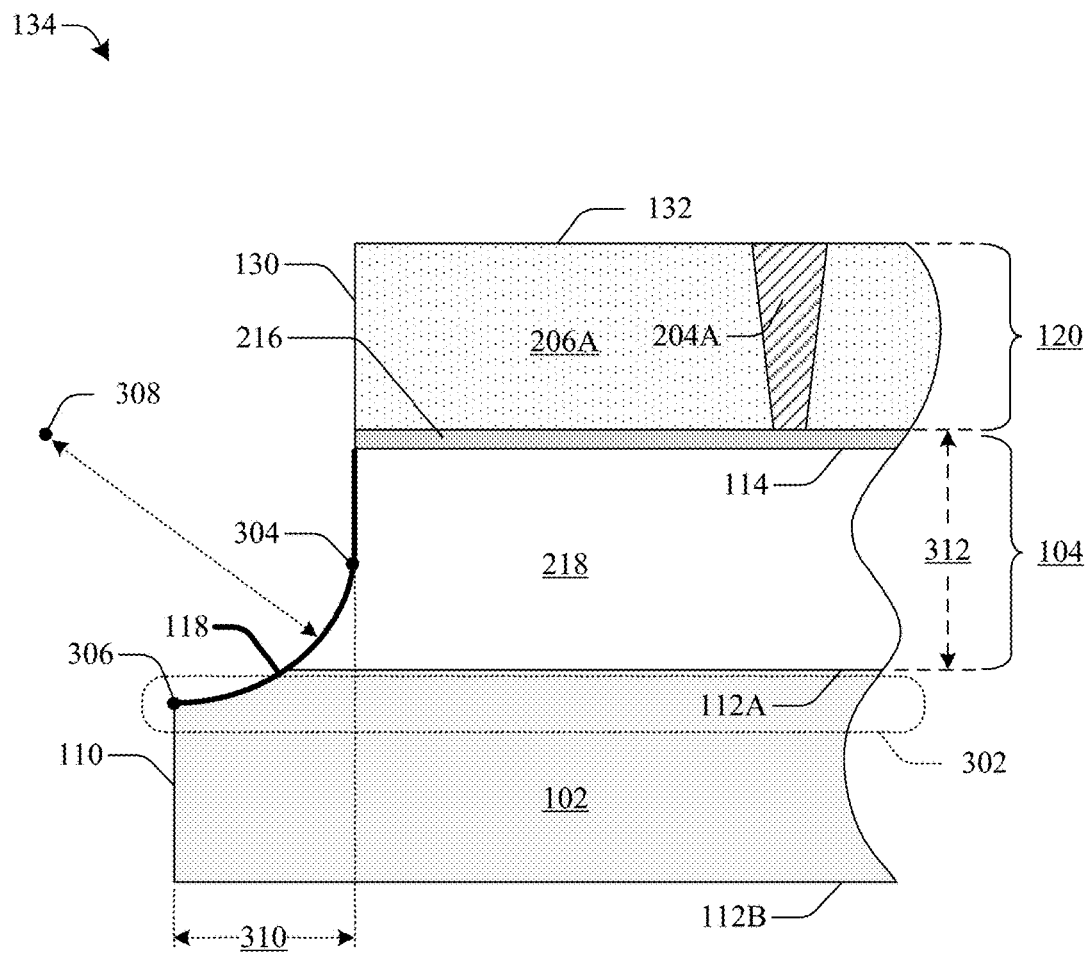
FIG. 3 illustrates a cross-sectional view of an edge of a die in accordance with some embodiments.

FIG. 3 illustrates a cross-sectional view of the edge 134 of the die 200. The edge 134 of the die 200 comprises a vertical dielectric sidewall 130 and tapered sidewall 118, which are formed by a laser that first forms a groove that penetrates through the device layer 104 (e.g., AlGaN layer 216 and the GaN layer 218), and into a near upper surface 302 of the substrate 102. The tapered sidewall 118 essentially includes one-half of a laser grooving profile (minus about a cutting diameter of the blade saw, and edge roughness, as is illustrated FIG. 5E). The tapered sidewall 118 forms a rounded, concave, or spherical surface, which extends from an outer edge 304 of the upper surface 114 of the device layer 104 to an upper edge 306 of the vertical substrate sidewall 110, and has a center of curvature 308, located diagonally above the tapered sidewall.

The vertical dielectric sidewall 130 extends downward from an upper surface 132 of the dielectric layer 120 to meet an uppermost point (i.e., the outer edge 304) of the tapered sidewall 118. In some embodiments, the vertical substrate sidewall 110 is separated from the vertical dielectric sidewall 130 by a forth distance 310 of about 10 µm, which results from about the cutting diameter of the blade saw (e.g., 40 µm) that is about 20 µm less than a grooving diameter of the laser (e.g., 60 µm). In some embodiments, the device layer 104 has a thickness of about 15 µm. The larger grooving diameter of the laser insures that the blade saw, once aligned to a centerline of the saw street, will not interact with the device layer 104.

Figure 4:
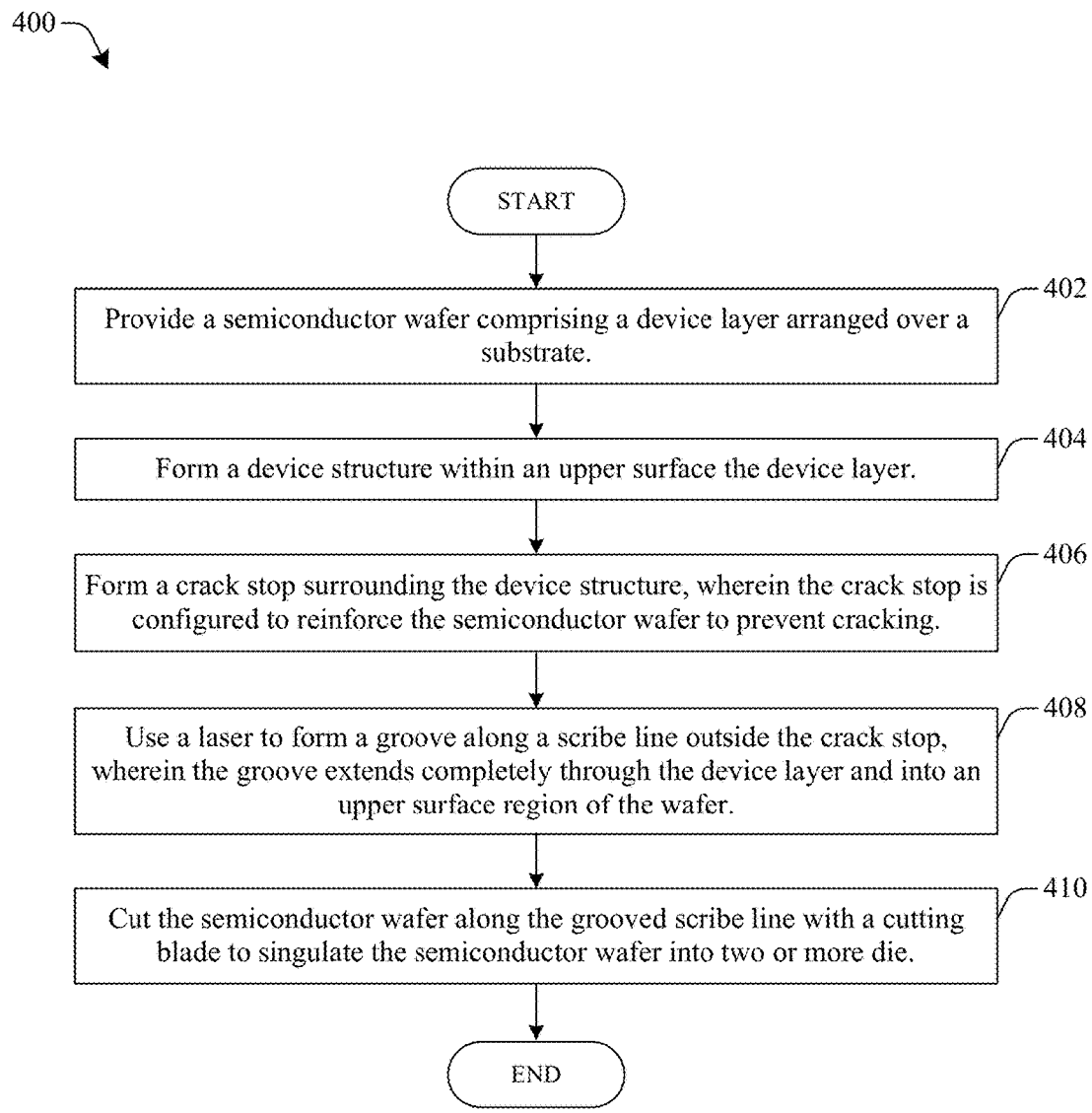
FIG. 4 illustrates a method of dicing a wafer in accordance with some embodiments.

FIG. 4 illustrates a method 400 of dicing a wafer in accordance with some embodiments. While method 400 is described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor wafer is provided including a device layer arranged over it. In some embodiments, the semiconductor wafer is a Si wafer. In some embodiments, the device layer comprises a heterojunction, which includes a group III-V compound layer (e.g., AlGaN) arranged over a III-N (tri nitride) compound layer (e.g., GaN).

At 404, a device structure is formed within an upper surface the device layer. In some embodiments, the device structure includes a high-electron-mobility transistor (HEMT) with a channel formed from a two-dimensional electron gas (2DEG) at an interface between the group III-V compound layer and the III-N compound layer. The wafer can also be a sapphire ($Al_2O_3$) wafer, or a silicon carbide (SiC) wafer, with a device layer grown thereon.

At 406, a crack stop is formed over an upper surface the device layer surrounding the device structure. The crack stop is configured to reinforce the semiconductor wafer to prevent cracking during dicing.

At 408, a laser is used to form a groove along a scribe line outside of the crack stop. The groove extends completely through the device layer and into an upper surface region of the semiconductor wafer.

At 410, the semiconductor wafer is cut along the grooved scribe line with a cutting blade to singulate the semiconductor wafer into two or more die. In some embodiments, the groove formed by the laser has a first width (e.g. 60 µm), and the cut made by the blade has a second width (e.g. 40 µm), which is less than the first width.

FIGS. 5A-5F illustrate a series of cross sectional views that collectively depict a method of dicing a wafer in accordance with some embodiments. Although FIGS. 5A-5F are described in relation to the method 400, it will be appreciated that the structures disclosed in FIGS. 5A-5F are not limited to the method 400, but instead may stand alone as structures independent of the method 400. Similarly, although the method 400 is described in relation to FIGS. 5A-5F, it will be appreciated that the method 400 is not limited to the structures disclosed in FIGS. 5A-5F, but instead may stand alone independent of the structures disclosed in FIGS. 5A-5F.

Figure 5A:
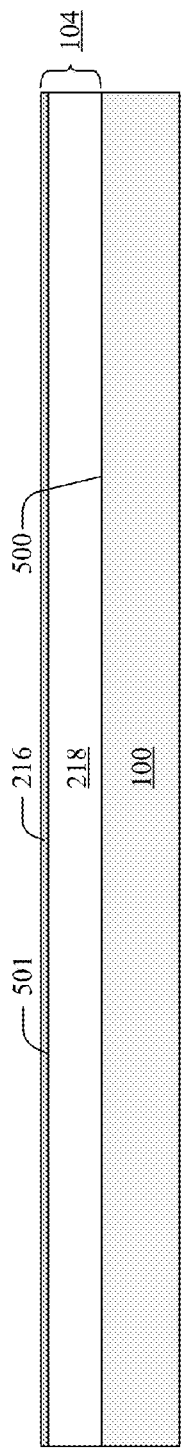
FIGS. 5A-5F illustrate a series of cross sectional views that collectively depict dicing a wafer in accordance with some embodiments.

FIG. 5A, which corresponds to act 402 of the method 400, illustrates a cross sectional view of a semiconductor wafer 100, whereupon a device layer 104 has been disposed. The device layer includes an AlGaN layer 216 arranged above a GaN layer 218. In some embodiments, GaN layer 218 and AlGaN layer 216 are disposed sequentially. The GaN layer 218 is first disposed epitaxially over an upper surface 500 of the semiconductor wafer 100, and the AlGaN layer 216 is next disposed epitaxially over an upper surface 501 of the GaN layer 218. In various embodiments, the GaN layer 218 and the AlGaN layer 216 are formed by a same or different deposition process(es). In various embodiments, the same or different deposition process(es) comprise one or more of chemical vapor deposition (CVD) (e.g., low-pressure CVD (LPCVD) or plasma-enhanced CVD (PECVD)), physical vapor deposition (PVD), atomic layer deposition (ALD), molecular beam epitaxy (MBE), electron beam (e-beam) epitaxy, or other appropriate deposition process.

Figure 5B:
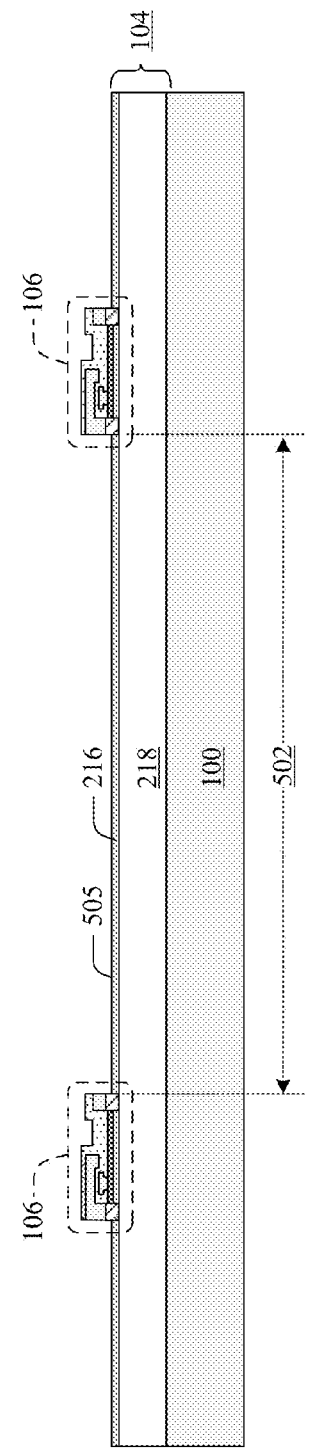

In FIG. 5B, which corresponds to act 404 of the method 400, device structures 106 have been formed within the device layer 104. In various embodiments, the device structures 106 include one or more high power transistors (e.g., VDMOS, DDDMOS, LDMOS, DEMOS, HEMT, etc.), which have been formed within the device layer 104. In some embodiments, the device layer 104 includes one or more epitaxially disposed layers for the purpose of strained channel formation, retrograde doping, heterostructure band formation, carrier mobility improvement, breakdown voltage improvement, and the like.

For the embodiments of FIGS. 5A-5F, the device structures 106 include HEMTs. In various other embodiments, the device structure 106 includes another type of HPFET device. Other types of HPFET devices include, for example, double diffused metal oxide semiconductors (DMOS) devices, such as vertical double diffused metal oxide semiconductor (VDMOS) devices, and double diffused drain metal oxide semiconductor (DDDMOS) devices; lateral diffused metal oxide semiconductor (LDMOS) devices; drain extended metal oxide semiconductor (DEMOS) devices; and insulated-gate bipolar transistor (IGBT), among others. In various embodiments, the HPFET device is p-type or n-type.

In various embodiments, the device structure 106 is included in an integrated circuit (IC) such as a microprocessor, memory device, and/or other IC. The IC may also include various passive and active microelectronic devices, such as resistors, capacitors, inductors, diodes, MOSFETs, complementary MOS (CMOS) transistors, BJTs, other HPFET devices, or other types of devices. One of ordinary skill may recognize other embodiments of semiconductor devices that may benefit from aspects of the present disclosure.

Figure 5C:
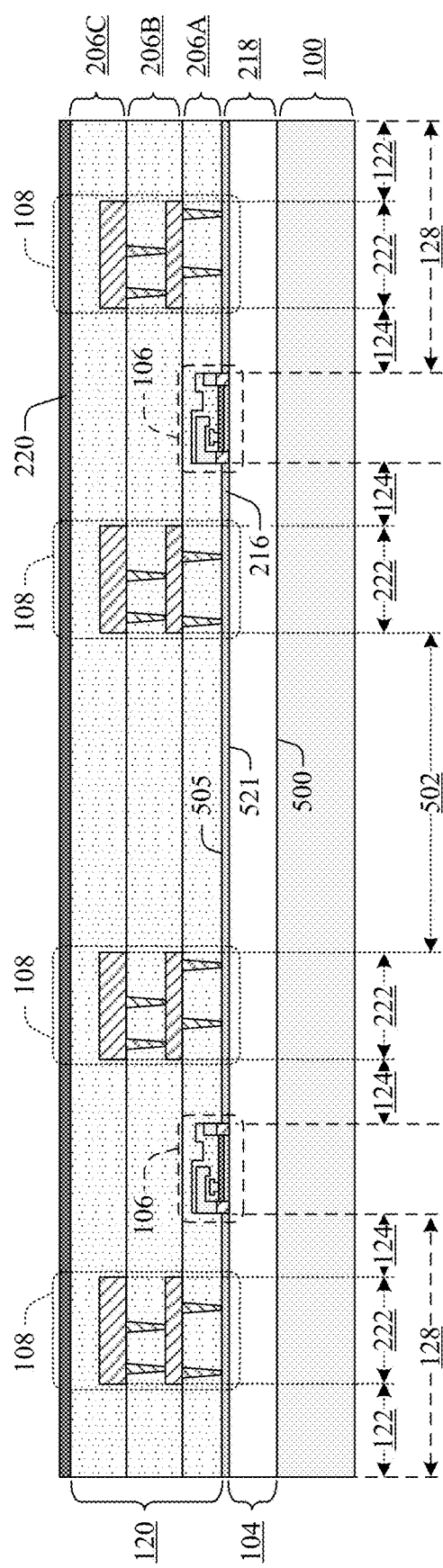

In FIG. 5C, which corresponds to act 406 of the method 400, a crack stop 108 has been formed within a dielectric layer 120 over the upper surface 505 of the AlGaN layer 216. In some embodiments, the AlGaN layer 216 is arranged in a region of the device structures 106, but not under the crack stop 108. Instead, the crack stop 108 is arranged on an upper surface 521 of the GaN layer 218. In other embodiments, both the AlGaN layer 216 and the GaN layer 218 are arranged locally in a region of the device structures 106, but not under the crack stop 108. Instead, the crack stop 108 is arranged on the upper surface 500 of the semiconductor wafer 100.

The crack stop 108 surrounds the device structures 106, and is separated from them by a second distance 124. The crack stop 108 includes a plurality of first vias 204A disposed within an ILD layer 206A. In some embodiments, the ILD layer 206A is formed over upper surface 505 of the AlGaN layer 216 using any conventional layer deposition process(es). Conventional layer deposition process(es) include CVD, a high density plasma (HDP) process, and the like. In various embodiments, the ILD layer 206A is a single layer of SiN or $SiO_2$, or other dielectric material. In various embodiments, the ILD layer 206A includes multiple layers of dielectric materials (e.g., a SiN and $SiO_2$ heterostructure). In various embodiments, other suitable dielectric material(s) are used to form the heterostructure. Trenches have then been formed within the ILD layer 206A, which correspond to the plurality of first vias 204A, through a photolithography pattern and etch process. The trenches are then filled with a conductive material such as copper, tungsten, aluminum, silver, gold, other metals, or alloys thereof, to form the plurality of first vias 204A. In some embodiments, the trenches are formed and filled to form the plurality of first vias 204A with a single-damascene process. In some embodiments, the crack stop 108 also includes an anchor, which includes one or more layers formed below the upper surface 500 of the semiconductor wafer 100.

The crack stop 108 also includes a first metallization layer 202A, which is disposed within an IMD layer 206B. Formation of the IMD layer 206B and the first metallization layer 202A can be achieved in a same manner as formation of the ILD layer 206A and the plurality of first vias 204A. In some embodiments, the first metallization layer 202A and the plurality of first vias 204A are formed simultaneously in a single deposition of the conductive material in a dual-damascene process.

Figure 5D:
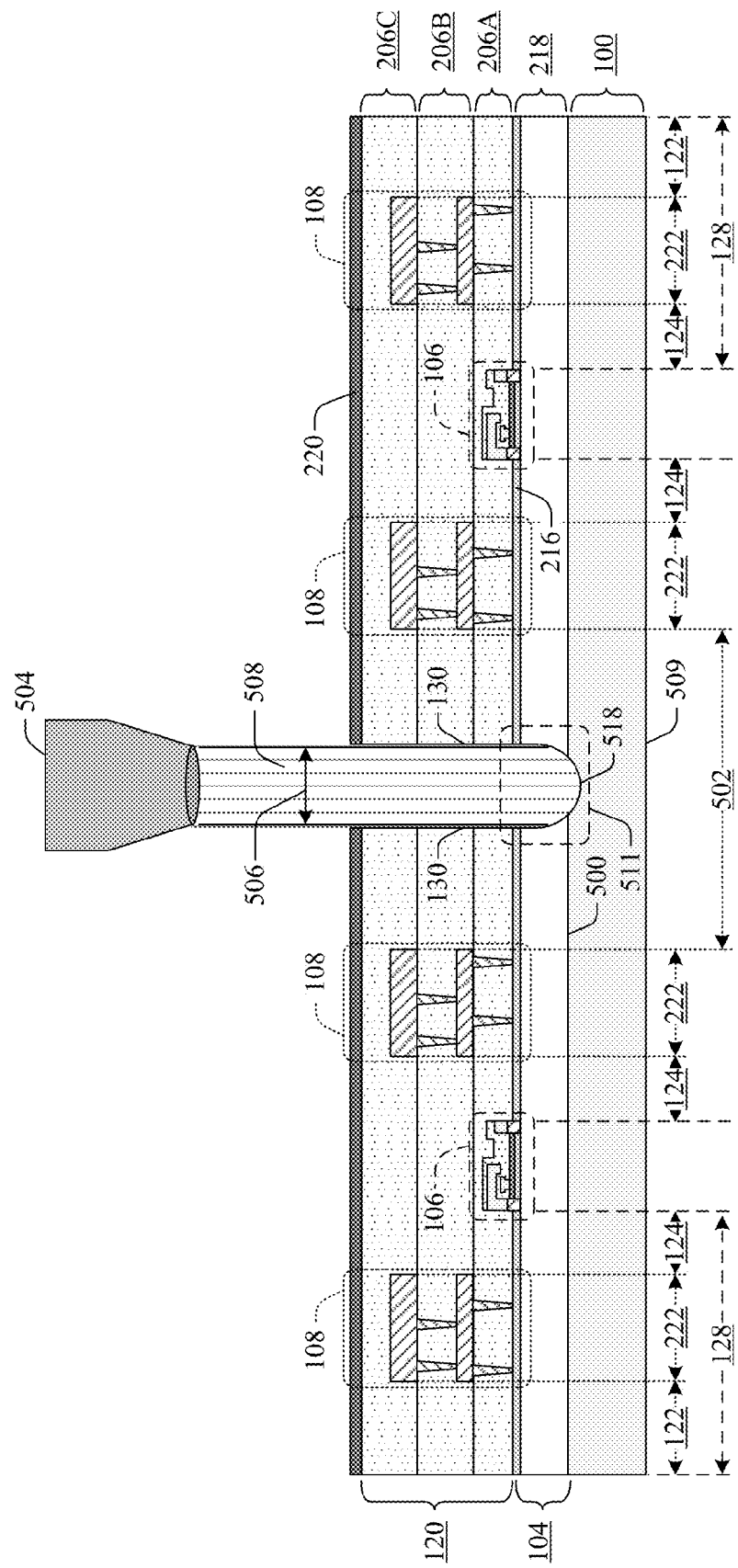

In FIG. 5D, which corresponds to act 408 of the method 400, a bottom surface 509 of the semiconductor wafer 100 is mounted to a holder (not shown) with an adhesive layer of double-sided tape, soluble glue, or other appropriate adhesion technique. A fifth spacing 502 between the device structures 106 is large enough to allow for a laser 504 to form a groove 511 along a scribe line (not shown) arranged between them. The groove 511 extends through the dielectric layer 120. The groove 511 establishes vertical dielectric sidewalls 130. The groove 511 also extends completely through the device layer 104 and into an upper surface region below the upper surface 500 of the semiconductor wafer 100, and terminates in a rounded, concave, spherical, or tapered surface 518 within the semiconductor wafer 100.

In various embodiments, the laser 504 is a solid-state laser, a yttrium-aluminum-garnet (YAG) laser, a neodymium-YAG laser, or other appropriate laser. In some embodiments, the laser 504 is water jet-guided laser beam. In a water jet-guided laser, the laser light is conducted to the workpiece by total internal reflection in a thin, stable, water jet, comparable to a core of an optical fiber. Water jet guiding helps to reduce localized heating, and limits a divergence of the laser light.

In some embodiments, width 506 of a laser beam 508 produced by the laser 504 is about 60 µm. In some embodiments, width 506 of a laser beam 508 is about four times larger than a thickness 312 of the device layer 104. By grooving the device layer 104 and the semiconductor wafer 100 with the laser 504, the device layer 104 is not subjected to the thermal and mechanical effects of a blade saw. Consequently, the device structures 106 are not degraded to damage to the device layer 104.

Figure 5E:
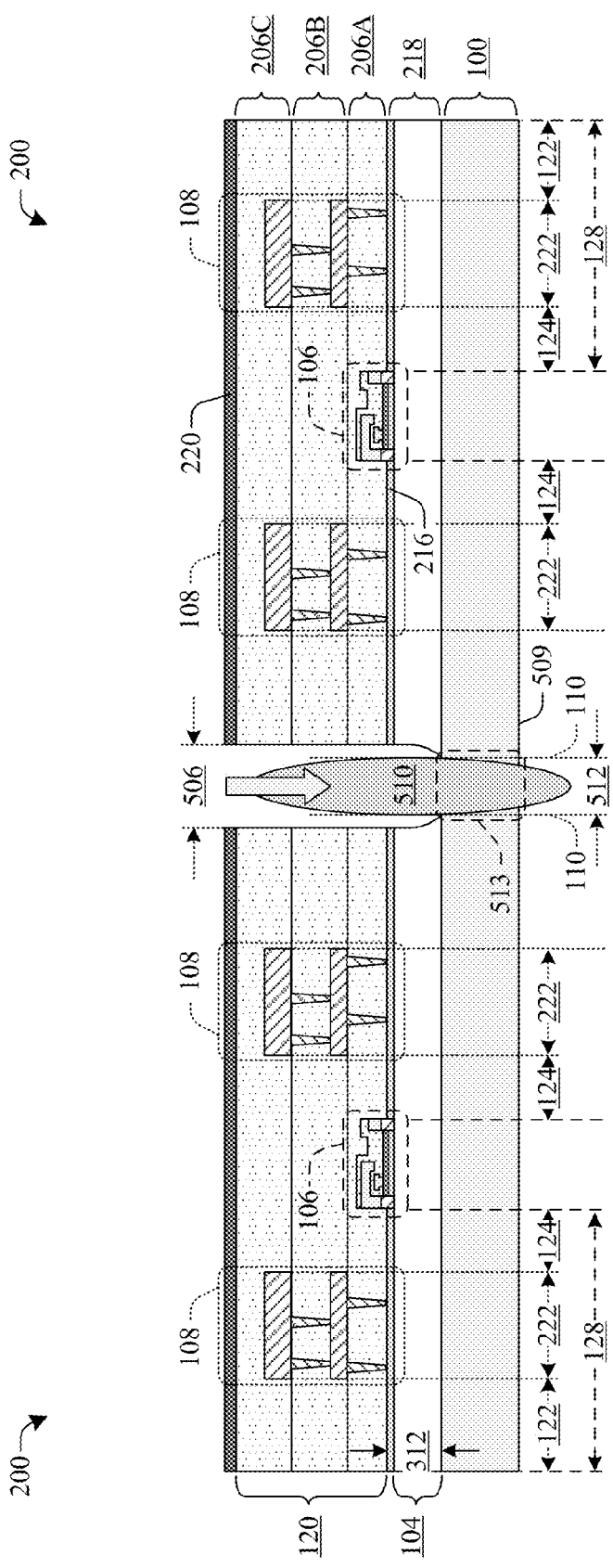

In FIG. 5E, which corresponds to act 410 of the method 400, the semiconductor wafer 100 is cut along the grooved scribe line with a blade saw 510, to singulate the semiconductor wafer 100 into two or more die 200 along vertical substrate sidewalls 110. The blade saw 510 is attached to a housing (not shown) that holds a motor (not shown) driving a rotor to which the blade saw 510 is fixed. In some embodiments, the blade saw 510 is configured to follow the laser 504 along a scribe in the same saw street being grooved by the laser 504, and to cut completely through the groove to the bottom surface 509 of the semiconductor wafer 100. In some embodiments, the blade saw 510 is a circular blade, which has a nickel-diamond cutting surface. A cut 513 formed by the laser 504 has a width 512 that is about equal to the cutting diameter of the blade saw (i.e., it's width) plus edge roughness. In some embodiments, the width 512 is about three times larger than the thickness 312 of the device layer 104.

The two act cutting process averts damage to the device layer 104 from the blade saw 510. In addition, the alternating dielectric and metallization layers of the crack stop 108 help to mechanically reinforce the die during wafer dicing, where a substantial amount of stress (energy) is generated from the cutting action of the blade saw 510 along the saw street (i.e., out of, or into, the page). This stress is transferred laterally to the die seal ring region and may cause cracking in weak materials or material interfaces, and cracking may propagate into the device structure 106, which usually renders the device structure 106 defective.

Figure 5F:
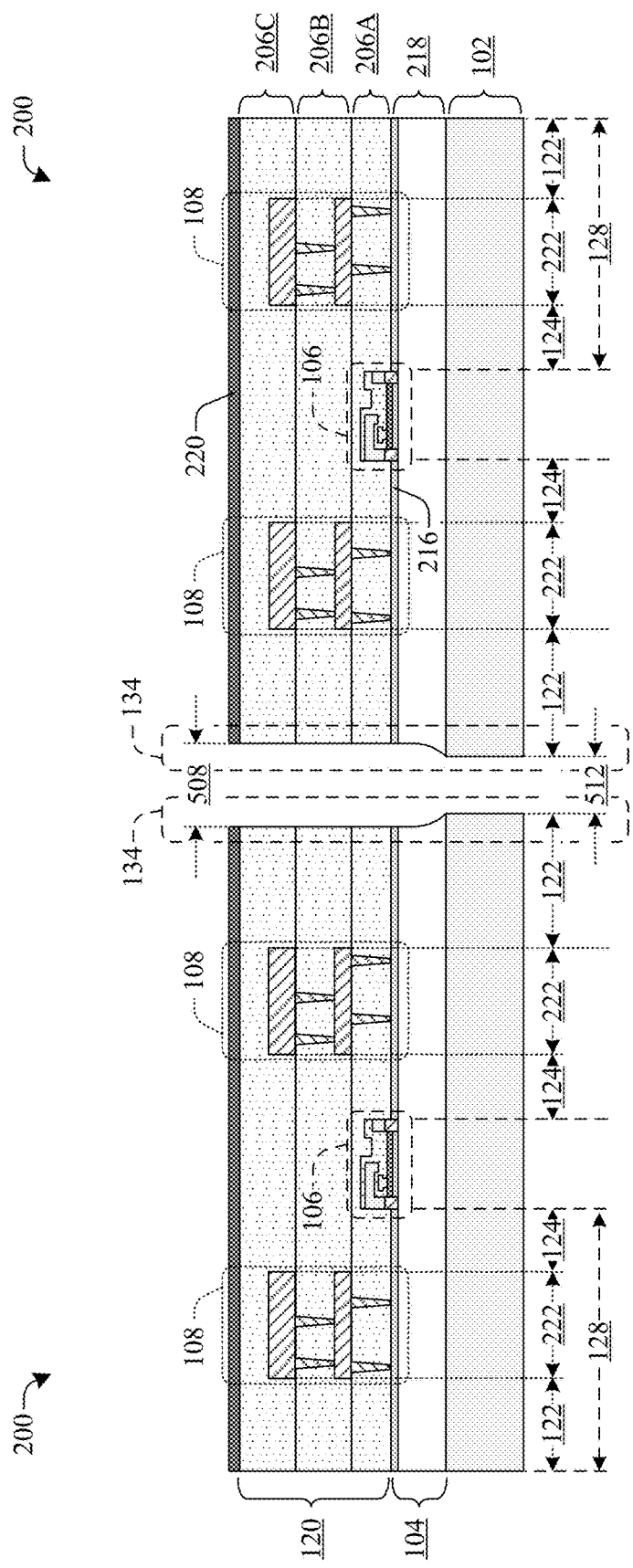

In FIG. 5F, the diced semiconductor wafer 100 forms two die 200.

Therefore, the present disclosure is directed to a method of dicing a semiconductor wafer. The semiconductor wafer that includes a device structure that is formed within a device layer. The device layer is arranged within an upper surface the device layer. A crack stop is formed, which surrounds the device structure and reinforces the semiconductor wafer to prevent cracking during dicing. A laser is used to form a groove along a scribe line outside the crack stop. The groove extends completely through the device layer, and into an upper surface region of the semiconductor wafer. The semiconductor wafer is then cut along the grooved scribe line with a cutting blade to singulate the semiconductor wafer into two or more die. By extending the groove completely through the device layer, the method avoids damage to the device layer caused by the blade saw, and thus avoids an associated performance degradation of the device structure.

Some embodiments relate to a die, comprising a substrate including upper and lower substrate surfaces with a vertical substrate sidewall extending there between. The vertical substrate sidewall corresponds to an outermost edge of the substrate. The due also comprises a device layer arranged over the upper substrate surface. The die further comprises a crack stop arranged over an upper surface of the device layer and having an outer perimeter that is spaced apart laterally from the vertical substrate sidewall. The die exhibits a tapered sidewall extending downward through at least a portion of the device layer to meet the vertical substrate sidewall.

Other embodiments relate to a die, comprising a silicon substrate including upper and lower substrate surfaces with a vertical substrate sidewall extending therebetween. The vertical substrate sidewall corresponds to an outermost edge of the silicon substrate. A gallium nitride (GaN) device layer is arranged over the silicon substrate. A crack stop is arranged over the GaN device layer. A layer of aluminum gallium nitride (AlGaN) is arranged between the GaN device layer and a bottom surface of the crack stop. A tapered sidewall extends downward from an upper surface of the GaN device layer through the GaN device layer and partially into the silicon substrate to meet the vertical substrate sidewall.

Still other embodiments relate to a method, comprising providing a semiconductor wafer comprising a device layer arranged over it. The method also comprises forming a device structure within an upper surface the device layer. The method further comprises forming a crack stop surrounding the device structure, wherein the crack stop is configured to reinforce the semiconductor wafer to prevent cracking. The method further comprises using a laser to form a groove along a scribe line outside the crack stop. The groove extends completely through the device layer and into an upper surface region of the semiconductor wafer. The method further comprises cutting the semiconductor wafer along the grooved scribe line with a cutting blade to singulate the semiconductor wafer into two or more die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor wafer comprising a device layer arranged thereover;
   forming a device structure on or within an upper surface the device layer;
   forming a crack stop surrounding the device structure, wherein the crack stop is configured to reinforce the semiconductor wafer to limit cracking;
   using a laser to form a groove along a scribe line outside the crack stop, wherein the groove has a bottommost surface recessed below the device layer and recessed into an upper surface region of the semiconductor wafer, wherein the groove establishes a first pair of vertical sidewalls on die regions directly adjacent to the groove, wherein the first pair of vertical sidewalls are spaced apart by a first distance corresponding to a width of the groove and wherein a bottom portion of the groove terminates in a rounded, concave, spherical, or tapered surface in the upper surface region of the semiconductor wafer; and
   cutting the semiconductor wafer along the groove with a cutting blade that passes through the bottommost surface of the groove to singulate the semiconductor wafer into two or more die.

2. The method of claim 1, further comprising:
   forming a dielectric layer over the device layer prior forming the groove; and
   forming the groove through the dielectric layer, wherein the groove establishes a vertical dielectric sidewall and terminates in the rounded, concave, spherical, or tapered surface in the upper surface region of the semiconductor wafer.

3. The method of claim 1, wherein cutting the semiconductor wafer along the groove establishes a second pair of vertical sidewalls extending downwardly from the rounded, concave, spherical, or tapered surface, wherein the second pair of vertical sidewalls are spaced apart by a second distance that is less than the first distance.

4. The method of claim 1:
wherein the semiconductor wafer comprises a group IV element; and
wherein the device layer comprises a group III-V compound.

5. The method of claim 1:
wherein the semiconductor wafer is made of silicon; and
wherein the device layer is made of GaN.

6. The method of claim 1, wherein the crack stop comprises a ring of alternating metallization layers and vias disposed within a dielectric.

7. A method, comprising:
providing a silicon wafer and a group III-V device layer disposed over an upper surface of the silicon wafer, wherein a plurality of die regions are arranged over the upper surface of the silicon wafer and are separated from one another by scribe lines;
forming a crack stop within a die region over the group III-V device layer, wherein the crack stop is configured to reinforce the silicon wafer to limit cracking;
using a laser to form a groove along a scribe line of the die region outside an outer perimeter of the crack stop, wherein the groove has a bottommost surface recessed below the group III-V device layer and recessed into an upper surface region of the silicon wafer without passing completely through the silicon wafer;
after the laser has been used to form the groove, tracing a cutting blade along the groove so the cutting blade passes through the bottommost surface of the groove to cut completely through the silicon wafer and singulate the silicon wafer into two or more die regions; and
forming a dielectric layer over the group III-V device layer, wherein the groove formed by the laser extends completely through the dielectric layer as well as through the group III-V device layer.

8. The method of claim 7 wherein the crack stop is rectangular.

9. The method of claim 7, further comprising forming a layer of aluminum gallium nitride (AlGaN) between an upper surface of the group III-V device layer and the crack stop.

10. The method of claim 1,
wherein the groove formed by the laser has a first width; and
wherein the cut made by the cutting blade has a second width, which is less than the first width.

11. The method of claim 10,
wherein the first width is about four times larger than a thickness of the device layer; and
wherein the second width is about three times larger than the thickness of the device layer.

12. The method of claim 7, wherein the group III-V device layer comprises gallium nitride (GaN).

13. The method of claim 7, further comprising:
forming the dielectric layer over the group III-V device layer prior forming the groove; and
using the laser to form the groove through the dielectric layer, wherein the groove establishes a vertical dielectric sidewall and terminates in a rounded, concave, spherical, or tapered surface in the upper surface region of the silicon wafer.

14. The method of claim 7:
wherein the groove formed by the laser has a first width; and
wherein the cut made by the cutting blade has a second width, which is less than the first width.

15. The method of claim 14,
wherein the first and second widths are each larger than a thickness of the device layer.

16. The method of claim 7,
wherein the groove establishes a first pair of vertical sidewalls on die regions directly adjacent to the groove, wherein the first pair of vertical sidewalls are spaced apart by a first distance corresponding to a width of the groove and wherein a bottom portion of the groove terminates in the rounded, concave, spherical, or tapered surface in the upper surface region of the silicon wafer.

17. The method of claim 16, wherein cutting the silicon wafer along the groove establishes a second pair of vertical sidewalls extending downwardly from the rounded, concave, spherical, or tapered surface, wherein the second pair of vertical sidewalls are spaced apart by a second distance that is less than the first distance.

18. A method, comprising:
providing a semiconductor wafer comprising a device layer arranged thereover;
forming a device structure on or within an upper surface the device layer;
forming a crack stop surrounding the device structure, wherein the crack stop has a first width and wherein the crack stop is configured to reinforce the semiconductor wafer to limit cracking;
using a laser to form a groove along a scribe line outside the crack stop, wherein the groove has a bottommost surface recessed below the device layer and recessed into an upper surface region of the semiconductor wafer;
cutting the semiconductor wafer along the groove with a cutting blade that passes through the bottommost surface of the groove to singulate the semiconductor wafer into two or more die;
forming an isolation region between an inner edge of the crack stop and the device structure, the isolation region having a second width;
forming the groove a distance away from an outer edge of the crack stop;
wherein the first and second widths are about equal; and
wherein the distance is larger than the first and second widths.

19. The method of claim 18:
wherein the groove formed by the laser has a groove width; and
wherein the cut made by the blade has a cut width, which is less than the groove width.

20. The method of claim 18, further comprising forming a dielectric layer over the device layer, wherein the groove formed by the laser extends completely through the dielectric layer as well as through the device layer.

* * * * *